United States Patent [19]

Koike et al.

[11] Patent Number: 5,760,460

[45] Date of Patent: Jun. 2, 1998

[54] LIGHT-EMITTING DIODE ARRAY

[75] Inventors: Masayoshi Koike, Yokohama; Masayuki Kuwabara, Kawasaki, both of Japan

[73] Assignee: Eastman Kodak Company, Rochester, N.Y.

[21] Appl. No.: 48,249

[22] Filed: Apr. 19, 1993

[30] Foreign Application Priority Data

Jul. 30, 1992 [JP] Japan .................................. 4-204134

[51] Int. Cl.$^6$ .............................. H01L 29/06; H01L 23/58
[52] U.S. Cl. .................................. 257/622; 257/594
[58] Field of Search ......................... 251/622, 594

[56] References Cited

U.S. PATENT DOCUMENTS 5,032,893  7/1991  Fitzgeral, Jr. et al. ................. 257/622

FOREIGN PATENT DOCUMENTS 55-107281  8/1980  Japan ................................ 257/94

*Primary Examiner*—Stephen Meier
*Attorney, Agent, or Firm*—Raymond L. Owens

[57] ABSTRACT

An array of light-emitting diodes each having a junction between a region of a first conductivity type and a region of a second conductivity type. The array fabrication process offers the elimination of wafer breakage is eliminated and an array with stable optical output power.

8 Claims, 2 Drawing Sheets

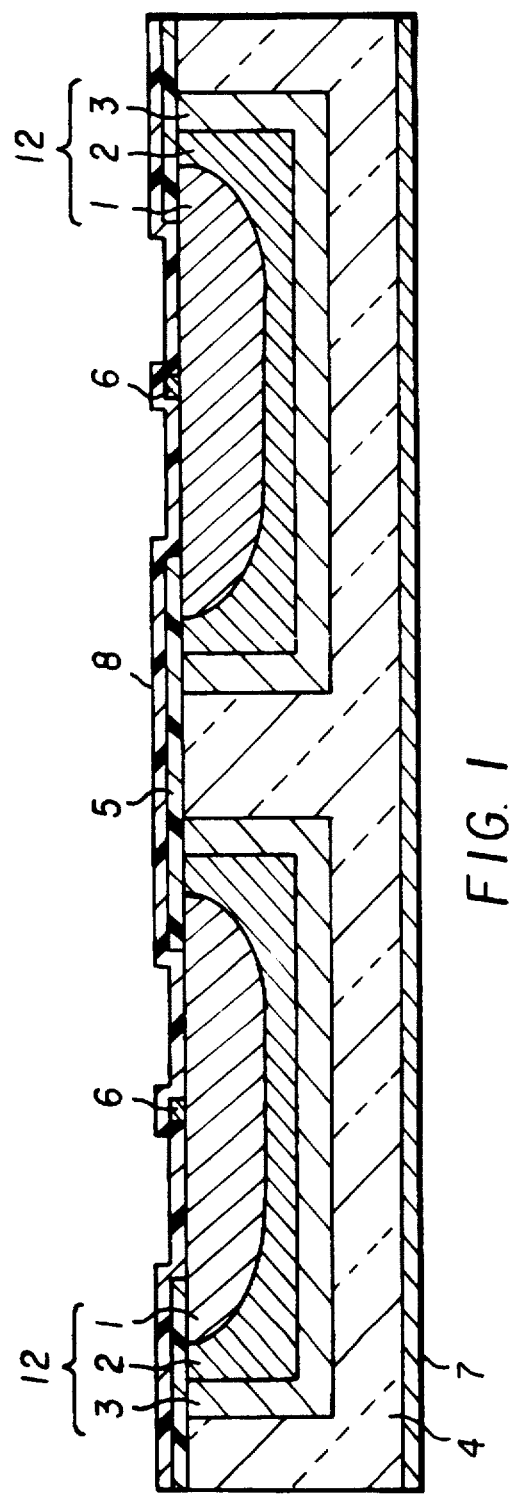
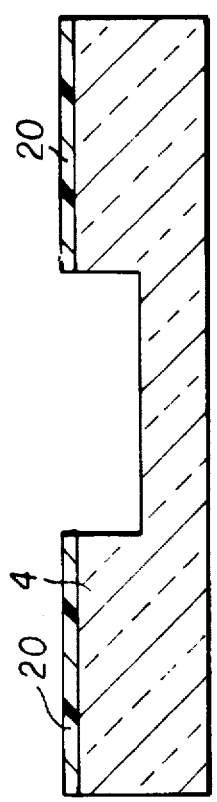
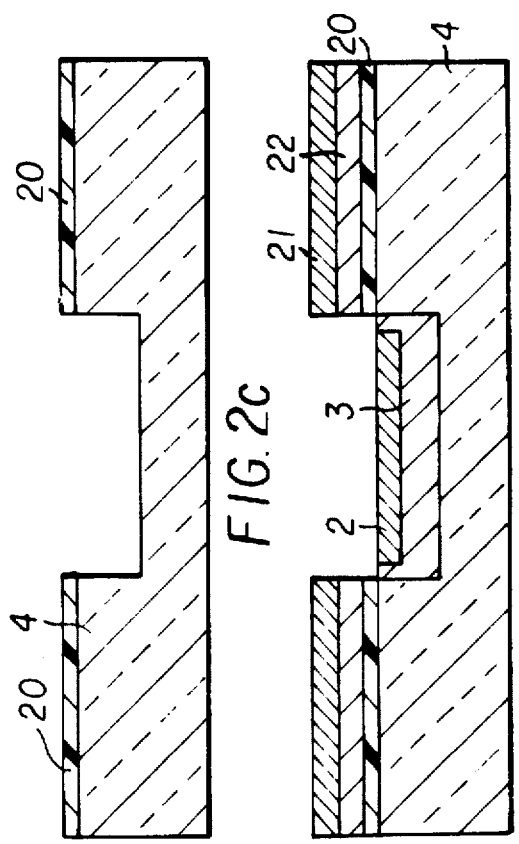
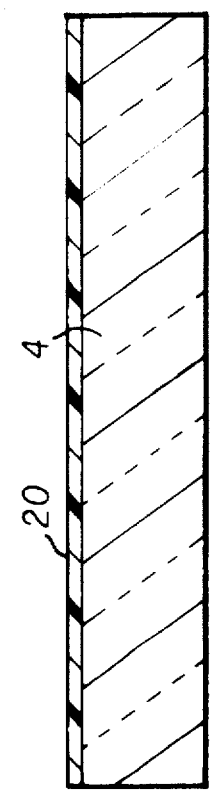
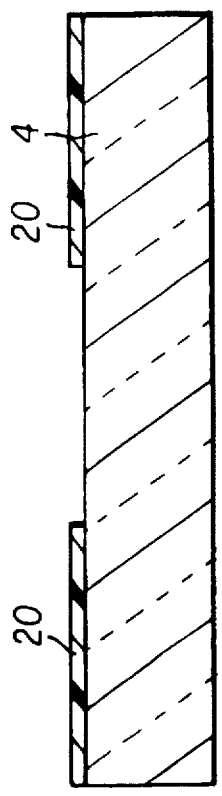

LIGHT-EMITTING DIODE ARRAY

BACKGROUND OF THE INVENTION

1. Field of the Invention

The present invention relates to a light-emitting diode array, and more particularly to a surface emitting type light-emitting diode array.

2. Description of the Prior Art

The small, light light-emitting diode (LED) is used widely in various fields. In recent years such light-emitting diodes are used in optical printers that use a beam of light to record information, in image and bar-code reading systems that utilize the intensity of a reflected beam of light, and in optical communications devices that utilize optical signals.

In particular, light-emitting diode arrays consisting of closely arrayed multiplicities of light-emitting diodes are used for the write head of LED printers. In an LED printer, the LED array print head is arranged across a photosensitive drum, and a rod-lens array is used to focus the light from the LED array to form images on the surface of the drum.

An LED printer requires no mechanical working parts as the individual LEDs are electrically controlled. This is in contrast to a laser beam printer which does require moving parts, such as the print head itself. Also unlike a laser beam printer, an LED printer does not require space for laser beam deflection purposes. As such, the LED printer can be made highly compact and has a high level of reliability.

FIG. 3 is a cross-sectional view of the structure of a conventional light-emitting diode array of an LED printer. Although the array is actually comprised of numerous LEDs, for simplicity only two light-emitting diodes are shown in FIG. 3.

The conventional LED array of FIG. 3 consists basically of a substrate, in this case an n-type GaAs substrate layer 34 (hereinafter referred to as "substrate layer 34") on which an epitaxial wafer is formed. More specifically, reference numeral 32 denotes an epitaxially formed n-type GaAsP layer region of a first conductivity type in which are formed p-type GaAsP layer regions 31 of a second conductivity type by the diffusion of zinc into the n-type GaAsP layer region 32 (and hereinafter referred to as the "zinc-diffused layer regions 31"). A light-emitting diode array having a light-emitting element layer is thus formed in which the n-type GaAsP layer region 32 is common to all of the zinc-diffused layer regions 31. For the diffusion of the zinc into the n-type GaAsP layer region 32, the upper surface of the n-type GaAsP layer region 32 is masked by a selective diffusion layer 35 that has a diffusion window via which the diffusion is carried out, thereby enabling the extent to which the zinc-diffused layer regions 31 are formed to be controlled.

A positive electrode (p-electrode) 36 is formed on the upper surface of the zinc-diffused layer 31 and a negative electrode (n-electrode) 37 on the lower surface of the substrate layer 34. When a forwardly biased voltage is applied to the junction thus formed between a zinc-diffused layer region 31 and the n-type GaAsP layer region 32, the electrical energy generated by the diffusion of the injected minority carriers is converted into optical energy, producing an emission of light.

However, when, as described above, GaAs, a two-element system (a binary compound semiconductor), is used for the substrate layer of a conventional light-emitting diode array, while GaAsP, a three-element system (a ternary compound semiconductor), is used for the epitaxial layer, the difference in lattice constant causes bowing of the epitaxial wafer in n-type GaAsP layer region 32, which causes bowing of the entire light-emitting diode array, including the substrate layer 34, as shown in FIG. 4. This bowing can cause wafer breakage during the array fabrication process, degrading device production efficiency.

Lattice mismatch between the substrate GaAs and epitaxial GaAsP layers also produces extensive misfit dislocation, which decreases the optical output uniformity of the discrete LEDs making up the array, and also accelerates aging of the individual diodes.

A further problem with conventional AlGaAs LEDs is that of crosstalk between adjacent diodes caused by lateral propagation of light through the AlGaAs. A measure that is generally used to prevent this involves etching the individual diodes in the form of mesas with the aim of achieving electrical isolation between diodes. However,there are also problems with this mesaform etching approach. For example, step coverage of the electrodes can be a problem when electrode material is being deposited and alloyed on the sloping side walls of mesas.

SUMMARY OF THE INVENTION

The object of the present invention is therefore to provide a light-emitting diode array wherein epitaxial bowing is eliminated, thereby eliminating breakage of wafers during the device fabrication process and providing good production efficiency.

A further object is to provide a light-emitting diode array that has a stable optical output and low aging characteristics, by reducing misfit dislocation and electrically isolating LEDs without using a mesaform structure so as to thereby reduce crosstalk caused by the lateral emission of light.

In accordance with the present invention, the above object is achieved by a light-emitting diode array comprising a substrate layer formed of two elements and a buried epitaxial layer region formed in the substrate layer by selective epitaxis, in which the epitaxial layer region comprises a first conductivity type region and a second conductivity type region having a mixed crystal composition of three or more elements, multiple epitaxial layer regions are arranged on the substrate layer, wherein light emission is produced by applying a forwardly-biased voltage across the junctions between the first and second conductivity type epitaxial layer regions. The object is also achieved by a light-emitting diode array as described above, in which regions of the second conductivity type are formed in a portion of the epitaxial layer region of the first conductivity type by impurity diffusion. The object is further achieved by a light-emitting diode array as described above, in which the epitaxial layer region of the first conductivity type and the regions of the second conductivity type are formed by a process of epitaxial growth with impurity addition. The object is also achieved by a light-emitting diode array as described above, in which the forbidden bandgap energy of the epitaxial layer region is greater than that of the substrate layer.

In the light-emitting diode array thus configured, for each light-emitting diode the epitaxial layer region that forms the light-emitting portion is buried in the substrate layer, thereby minimizing the surface area of the epitaxial layer region which has a lattice constant which differs from that of the substrate layer. In other words, the total surface area of the epitaxial layer region is made much smaller than the total surface area of the substrate layer.

The result is a reduction in epitaxial wafer bowing and misfit dislocation caused by lattice mismatch.

Also, having the light-emitting epitaxial layer region of each light-emitting diode buried in the substrate layer and an epitaxial layer region with a greater forbidden bandgap energy than that of the substrate layer increases the absorption index of the light in the substrate layer, as a result of which light propagating laterally in the substrate is absorbed, eliminating the need to use mesaform etching. At the same time, the individual diodes are electrically isolated and step coverage caused by the mesaform etching process is prevented.

Further features of the invention, its nature and various advantages will become more apparent from the accompanying drawings and following detailed description of the invention.

BRIEF DESCRIPTION OF THE DRAWINGS

FIG. 1 is an illustrative cross-sectional view of a light-emitting diode array according to the present invention;

DESCRIPTION OF THE PREFERRED EMBODIMENTS

Figure 2E:
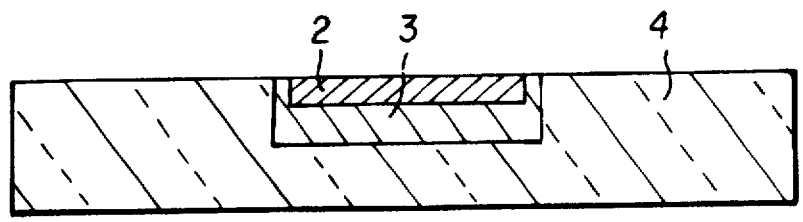
FIG. 2 is a cross-sectional view illustrating the steps of forming a light-emitting diode array according to the present invention.
Figure 3:
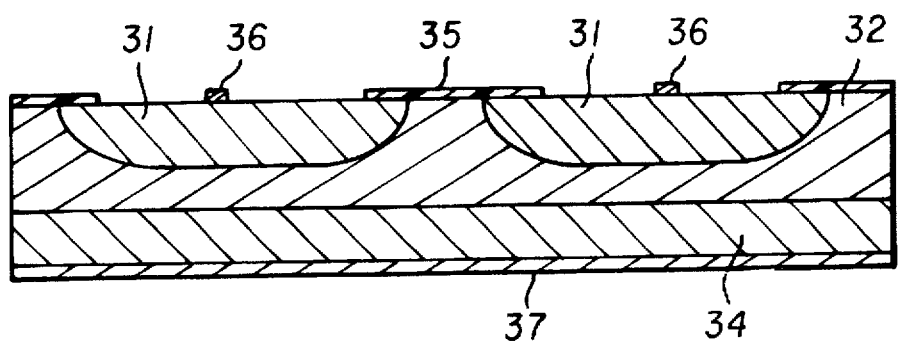
FIG. 3 is an illustrative cross-sectional view of a conventional light-emitting diode array.
Figure 4:
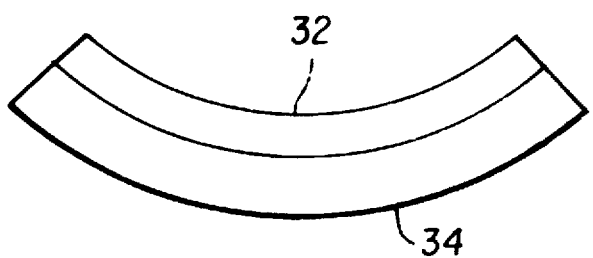
FIG. 4 is a view illustrating a drawback of the conventional light-emitting diode array.

The light-emitting diode array according to the present invention is comprised of a multiplicity of closely arrayed LEDs. For simplicity, the description will be given with reference to just two light-emitting diodes.

As illustrated in FIG. 1, the light-emitting diode array consists basically of a substrate layer in which are buried the epitaxial layer regions for each LED. More specifically, epitaxial layer regions 12 are grown in channels formed at prescribed locations in an n-type GaAs substrate layer 4 (hereinafter referred to as "substrate layer 4"). The epitaxial layer regions 12 are formed of n-type GaAsP of a first conductivity type. Zinc is diffused into a portion of each of the epitaxial layer regions 12 to form a p-type GaAsP layer region 1 (hereinafter referred to as "zinc-diffused layer region 1") of a second conductivity type. A positive electrode (p-electrode) 6 is formed on the upper surface of the zinc-diffused layer region 1 and a negative electrode (n-electrode) 7 on the lower surface of the substrate layer 4. When a forwardly biased voltage is applied across electrodes 6 and 7, light is emitted from the junction between an epitaxial layer region 12 and the zinc-diffused layer region 1 formed in the epitaxial layer region 12. The present invention is characterized by the fact that, as shown in FIG. 1, for each LED an epitaxial layer region 12 containing a zinc-diffused layer region 1 is buried in the substrate layer 4.

The steps of fabricating the light-emitting diode array thus configured will now be described with reference to FIG. 2. With reference first to FIG. 2(a), CVD or sputtering is used to form a silicon oxide selective etching mask 20 on the substrate layer 4, and photolithography is used to form the etching window shown in FIG. 2(b). In the next step, shown by FIG. 2(c),the etching window is used to etch a channel portion in the substrate layer 4. Dry etching or the like may be used for this. Next, with reference to FIG. 2(d), a GaAsP region is epitaxially grown in the substrate channel. Because the initially-grown part of the epitaxial region, that is the part adjacent to the substrate layer 4, has poor quality crystal, the epitaxial region is formed as two layers, a buffer layer 3 in contact with the substrate layer 4 and a light-emitting layer 2. The presence of the light-emitting layer 3 prevents misfit dislocations caused by lattice constant differentials being introduced into the light-emitting layer 2. Polycrystalline GaAsP 21 and 22 precipitates on the selective etching mask 20. Next, hydrofluoric acid etching fluid is used to etch away the selective etching mask 20 together with the GaAsP 21 and 22. This produces an epitaxial wafer with islands of epitaxially grown regions 12 buried in the substrate layer 4, as shown in FIG. 2(e).

Next, a selective diffusion layer 5 provided with a diffusion window is formed of SiN or the like on the light-emitting layer 2, and the diffusion window is used to diffuse zinc into the light-emitting layer 2 to form a region of a second conductivity type, that is, the p-type zinc-diffused semiconductor region 1. Photolithography is then used to deposit a layer of aluminum on top of the zinc-diffused layer region 1, the p-electrode 6 is formed and the wafer is heated to alloy it. A layer of AuGe/Ni/Auis then deposited on the lower face of the n-type substrate layer 4 to form the n-electrode 7 and the wafer is again heated to alloy it. Finally, a passivation layer 8 is formed on the surface via which the zinc was diffused in order to protect the diode from degradation caused by humidity and the like. A bonding pad is formed separated from the light-emitting region by a prescribed distance.

In the light-emitting diode array thus formed, for each diode a light-emitting epitaxial layer region 12 that is slightly larger than the zinc-diffused layer region 1 is buried in the substrate layer, enabling the surface area of the epitaxial layer regions 12, the lattice constant of which differs from that of the substrate layer 4, to be reduced to the minimum. In other words, the total surface area of the epitaxial layer regions 12 can be made very small compared to the total surface area of the substrate layer 4. This minimizes epitaxial wafer bowing and misfit dislocation caused by lattice mismatch.

Although the light-emitting diode array has been described with reference to GaAs and GaAsP, it is to be understood that the invention is not limited thereto but encompasses the use of other compositions such as AlGaAs, GaInAs and AlGaInP, for example, which, with the corresponding use of GaAs, InP, GaP and such like materials for the epitaxial layers, will provide the same effect.

Also, while the light-emitting diode array hasbeen described with reference to a light-emitting p-n junction formed by diffusing zinc into part of an epitaxial layer region of a first conductivity type to form a region of a second conductivity type, the method of forming the p-n junction is not limited thereto. Instead, a p-n junction structure obtained by impurity-doping of acceptor and donor during the epitaxial growth process may be used.

Furthermore, when forming a light-emitting diode array, as described above, by growing AlGaAs epitaxial layers in a GaAs substrate layer, crosstalk between the individual diodes can be prevented by making the forbidden bandgap energy of the AlGaAs epitaxial layer region greater than that of the GaAs substrate layer. It is known that light readily passes through a semiconductor that has a large bandgap, but it is difficult for light to pass through a semiconductor with a small bandgap. In other words, decreasing the bandgap of the GaAs substrate increases the light absorption index. Thus, with the diodes formed as epitaxial layer regions individually buried in the substrate, light that is propagating laterally is absorbed by the substrate.

The invention has been described in detail with particular reference to certain preferred embodiments thereof, but it will be understood that variations and modifications can be effected within the spirit and scope of the invention.

What is claimed is:

1. A light-emitting diode array comprising:

a first conductivity type substrate;

a multiplicity of first conductivity type epitaxial layers, including a first epitaxial layer and subsequent epitaxial layers, including a last epitaxial layer, the first epitaxial layer being formed in a portion of the substrate by selective epitaxis, each subsequent epitaxial layer being formed in a portion of the previous subsequent epitaxial layer by selective epitaxis;

a second conductivity type layer formed in a portion of the last epitaxial layer by impurity diffusion;

the substrate having a lower surface with a first conductivity type electrode thereon;

the second conductivity type layer having an upper surface with a second conductivity type electrode thereon;

the last epitaxial layer and the second conductivity type layer having a junction, wherein light is emitted from the junction when a forwardly biased voltage is applied across the electrodes; and wherein the first epitaxial layer and any subsequent epitaxial layers act as a buffer between the substrate and the last epitaxial layer.

2. A light-emitting diode array according to claim 1, wherein the last epitaxial layer is a light emitting layer.

3. A light-emitting diode array according to claim 1, wherein all the epitaxial layers are buried in the substrate.

4. A light-emitting diode array according to claim 1, wherein the last epitaxial layer is a light emitting layer buried in the substrate.

5. A light-emitting diode array according to claim 4, wherein light-emitting last epitaxial layer has a forbidden bandgap energy and the substrate has a forbidden bandgap energy, wherein the forbidden bandgap energy of the light-emitting last epitaxial layer is greater than that of the substrate.

6. A light-emitting diode array according to claim 1, wherein the epitaxial layers have a lattice constant and the substrate has a lattice constant, wherein the lattice constants are different.

7. A light-emitting diode array according to claim 1, wherein the epitaxial layers have a total surface area and the substrate has a total surface area, wherein the total surface area of the epitaxial layers is much smaller than the total surface area of the substrate.

8. A light-emitting diode array comprising:

a first conductivity type substrate;

a buffer, first conductivity type epitaxial layer formed in a portion of the substrate by selective epitaxis;

a light-emitting, first conductivity type epitaxial layer formed in a portion of the buffer layer by selective epitaxis;

a second conductivity type layer formed in a portion of light emitting, first conductivity layer by impurity diffusion;

the substrate having a lower surface with a first conductivity type electrode thereon;

the second conductivity type layer having an upper surface with an electrode thereon; and the light-emitting epitaxial layer and the second conductivity type layer having a junction, wherein light is emitted from the junction when a forwardly biased voltage is applied across the electrodes.

* * * * *